United States Patent [19]

Deguchi et al.

[11] Patent Number: 5,662,965
[45] Date of Patent: Sep. 2, 1997

[54] METHOD OF DEPOSITING CRYSTALLINE CARBON-BASED THIN FILMS

[75] Inventors: Masahiro Deguchi; Masatoshi Kitagawa; Takashi Hirao, all of Osaka, Japan

[73] Assignee: Matsushita Electric Industrial Co., Ltd., Osaka, Japan

[21] Appl. No.: 351,739

[22] Filed: Dec. 8, 1994

Related U.S. Application Data

[63] Continuation of Ser. No. 724,383, Jun. 28, 1991, abandoned.

[30] Foreign Application Priority Data

Jun. 29, 1990 [JP] Japan ................................ 2-173463

[51] Int. Cl.$^6$ .......................... C23C 16/00; C23C 14/30; B05D 3/06
[52] U.S. Cl. .......................... 427/249; 427/566; 427/568; 427/577; 427/575; 427/255; 427/255.1; 427/255.2; 427/255.7
[58] Field of Search .......................... 427/249, 255, 427/255.1, 255.2, 255.7, 566, 568, 577, 575; 177/929, 108; 423/446; 428/408

[56] References Cited

U.S. PATENT DOCUMENTS

| | | | |
|---|---|---|---|
| 4,162,338 | 7/1979 | Schintlmeister | 427/255.7 |
| 4,315,968 | 2/1982 | Suplinskas et al. | 426/367 |
| 4,340,636 | 7/1982 | DeBolt et al. | 428/215 |
| 4,341,834 | 7/1982 | Kikuchi et al. | 427/255.7 |
| 4,436,775 | 3/1984 | Graham | 427/255.7 |
| 4,634,600 | 1/1987 | Shimizu et al. | 427/527 |
| 4,702,960 | 10/1987 | Ogman | 428/367 |
| 4,904,542 | 2/1990 | Mroczkowski | 428/610 |
| 4,950,558 | 8/1990 | Sarin | 428/698 |
| 5,035,923 | 7/1991 | Sarin | 427/255 |

FOREIGN PATENT DOCUMENTS 63-224225  9/1988  Japan.

Primary Examiner—Roy V. King
Attorney, Agent, or Firm—Amster, Rothstein & Ebenstein

[57] ABSTRACT

Crystalline carbon-based thin film structures are formed in which a compositionally-graded intermediate layer is first deposited on a substrate, and a crystalline carbon-based thin film such as silicon carbide or diamond is deposited thereafter on the intermediate layer. The compositionally-graded intermediate layer has a carbon content which increases in a direction away from the substrate. The compositionally-graded intermediate layer is effective in reducing problems associated with the lattice mismatch between the thin film and the substrate which hamper conventional heteroepitaxial growth of high quality crystalline carbon-based thin films.

13 Claims, 2 Drawing Sheets

METHOD OF DEPOSITING CRYSTALLINE CARBON-BASED THIN FILMS

This is a continuation of application Ser. No. 07/724,383 filed on Jun. 28, 1991, now abandoned.

This invention is directed to crystalline carbon-based thin films and methods for manufacturing such films. Carbon-based thin films having crystalline properties are of great interest in applications which range from the development of hard wear-resistant coatings, insulating layers, and semiconductor layers for use in the fabrication of semiconductor devices.

BACKGROUND OF THE INVENTION

In order to obtain carbon-based thin films having high quality crystalline properties, it is essential to eliminate problems caused by the mismatch between the lattice constant of the thin film and that of the substrate material. In order to reduce the problem of lattice mismatch in the prior art, proper choice of the substrate onto which the films are deposited and appropriate surface processing of the substrate prior to deposition have been very important considerations in the development of high quality thin films.

By way of example, high quality diamond films have been deposited in the prior art onto a single crystal diamond substrate. This type of deposition, wherein the thin film and the substrate material are identical, is an example of "homo-epitaxial" film growth. Film deposition in which the substrate material is different from that of the depositing thin film material is correspondingly termed "hetero-epitaxial" film growth. The development of hetero-epitaxial growth techniques that are not limited by the choice of substrate and substrate processing requirements is a subject that is currently receiving a great amount of attention.

By using the techniques disclosed herein, crystalline carbon-based thin films can be deposited on a variety of different and readily available substrates, thereby expanding the useful range of applications for crystalline carbon-based thin films. In particular, the hetero-epitaxial growth of crystalline carbon-based thin films such as diamond on a silicon substrate is considered to be highly desirable because of the availability of high quality, large area silicon substrates and the applicability of crystalline carbon thin films grown on silicon substrates to the fabrication of hybrid semiconductor device structures. In addition to diamond thin films, silicon carbide thin films are another example of a crystalline carbon-based thin film system which is desirably deposited onto a silicon substrate by hetero-epitaxy. Development of hetero-epitaxial growth techniques is particularly important for crystalline carbon-based systems because the use of diamond or silicon carbide single crystal substrates is impractical. Such substrates are very expensive and are virtually impossible to obtain in large areas.

In the prior art, the hetero-epitaxial deposition of diamond or silicon carbide thin films generally has required pre-processing of the silicon substrate. For example, prior to the deposition of diamond thin films on a silicon substrate, the surface of the silicon substrate has been intentionally roughened in the prior art in order to enhance the number of nucleation sites on the substrate and thereby aid in the growth of the thin film. Roughening of the silicon substrate has been performed in the prior art by ion beam bombardment of the substrate with inert gas ions (e.g. argon) or by using mechanical abrasives.

In the case of silicon carbide thin film deposition, prior art methods have carbonized the surface of the silicon substrate prior to deposition. Other prior art methods have used specially prepared silicon substrates having crystallographic surface orientations that are offset by several degrees from the (100) crystallographic plane of silicon, so as to relieve the film stress which arises from the inherent lattice constant mismatch between the silicon substrate and the deposited silicon carbide thin film. Pre-processing of the substrate surface in the prior art has therefore been an important prerequisite to the deposition of high quality crystalline carbon-based thin films using hetero-epitaxial film growth.

Whereas the prior art has experimented with various methods to increase the nucleation density and to relieve lattice mismatch, these prior art methods have inherent problems. For example, while the selection of the surface orientation of the substrate material can play an important role in facilitating the matching of lattice constants between the substrate material and the deposited film, it is difficult and time consuming to control the crystal orientation of the surface of the substrate material and the high density of surface defects generated by the lattice mismatch is difficult to remove.

Thus, the presently available substrate materials and surface processing techniques for depositing high quality crystalline carbon-based thin films are inadequate. Particularly in the context of hetero-epitaxial growth, methods for fully solving the fundamental lattice mismatch problem are not available.

SUMMARY OF THE INVENTION

It is an object of the present invention to solve the above-mentioned problems of the prior art and provide high grade hetero-epitaxially grown crystalline carbon-based thin films with crystalline properties that are not degraded by problems associated with lattice mismatch.

It is a further object of the present invention to provide methods for hetero-epitaxial growth of crystalline carbon-based thin films on substrates of different crystal types at low temperatures.

To accomplish these and other objects, the invention provides for a compositionally-graded region which is first deposited onto the substrate to form an intermediate layer. The crystalline carbon-based thin film is then deposited onto the intermediate layer. In the intermediate layer, the carbon content increases continuously and the content of substrate atoms decreases continuously in a direction away from the substrate surface, so as to provide a smoothly graded composition between the substrate and the crystalline carbon-based thin film that is subsequently deposited thereon. By forming a compositionally-graded intermediate layer that includes both substrate atoms and carbon atoms, the lattice mismatch between the substrate material and the deposited crystalline carbon-based thin film can be relieved. By gradually changing the amount of carbon in the intermediate layer, there is gradual transition from the crystal structure of the substrate material to the crystal structure of the carbon-based thin film, which therefore permits the crystalline carbon-based thin film to be readily deposited without adverse effects on its intrinsic crystallographic properties.

BRIEF DESCRIPTION OF THE DRAWINGS

For a more complete understanding of the nature, features and advantages of the present invention, there is provided below a detailed description of a preferred, but nonetheless illustrative embodiment of the invention, which is illustrated by and best understood with reference to the accompanying drawings wherein.

DESCRIPTION OF THE PREFERRED EMBODIMENTS

Figure 1:
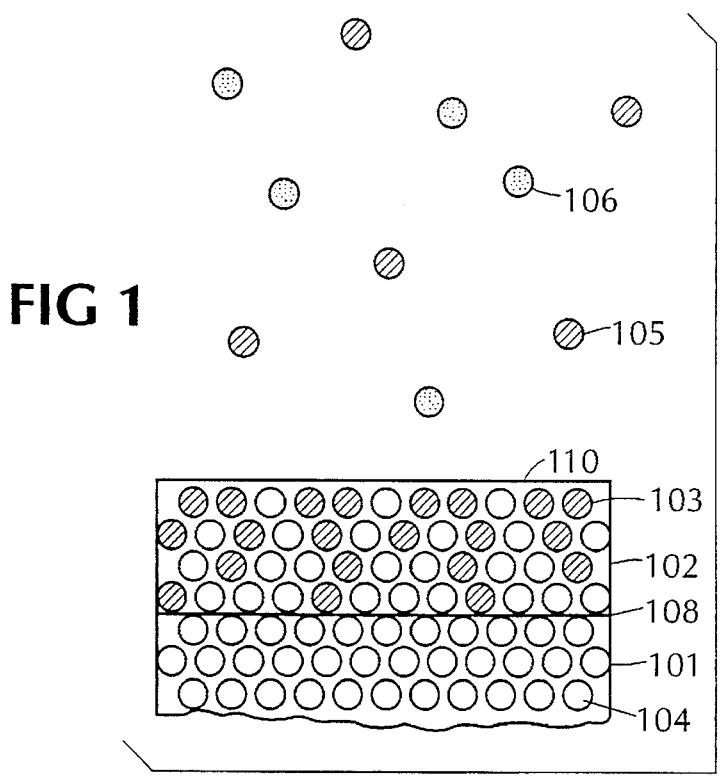
FIG. 1 shows a schematic cross-sectional view of the compositionally-graded intermediate layer of the invention onto which a crystalline carbon-based thin film is then deposited. The compositionally-graded intermediate layer contains substrate atoms (e.g. silicon) and carbon atoms. The number of carbon atoms increases in a direction away from the substrate, while the number of substrate atoms decreases in that direction.

An understanding of the invention may be had with reference to FIG. 1, which schematically illustrates a substrate 101 onto which atoms are deposited to form an intermediate layer 102. Individual substrate atoms 104 are denoted by circles such as circle 104. The surface 108 of substrate 101 has deposited thereon a compositionally-graded intermediate layer 102 which consists of carbon atoms 103 and substrate atoms 104. In the preferred embodiment, the number of carbon atoms 103 within the compositionally-graded intermediate layer 102 increases in a direction away from the surface 108 of the substrate 102. Likewise, the number of substrate atoms 104 continuously decreases in a direction away from the surface 108 of the substrate 102.

By providing this compositionally-graded intermediate layer 102, the surface 110 of the intermediate layer 102 acquires a surface structure and surface states which more closely reflect the crystallographic properties of the crystalline carbon-based thin film that is subsequently deposited thereon, thereby aiding in the growth of a high quality crystalline carbon-based thin film.

The gradation in composition of the intermediate thin film layer 102 is achieved by controlling the relative fluxes of carbon-containing species (atoms or particles) and substrate-containing species (particles or atoms) that impinge on the surface of the growing intermediate layer. This may be accomplished by controlling the ratio of gas phase particles 105, which contain carbon atoms, to gas phase particles 106, which contain atoms of the substrate material 101. For example, as one method of producing the compositionally-graded intermediate layer 102, a gas containing carbon atoms, or a mixture of gases containing carbon atoms may be used instead of particles 105, which contain carbon atoms.

As further examples of methods for depositing a compositionally-graded intermediate layer and a crystalline carbon-based thin film thereon, a gas containing the atomic constituents of the carbon-based thin film and substrate may be decomposed; a mixture of gases containing the requisite atomic constituents may be used; or particle beams of the atomic constituents may be provided. Depositions that incorporate a combination of these methods may also be utilized.

Figure 2:
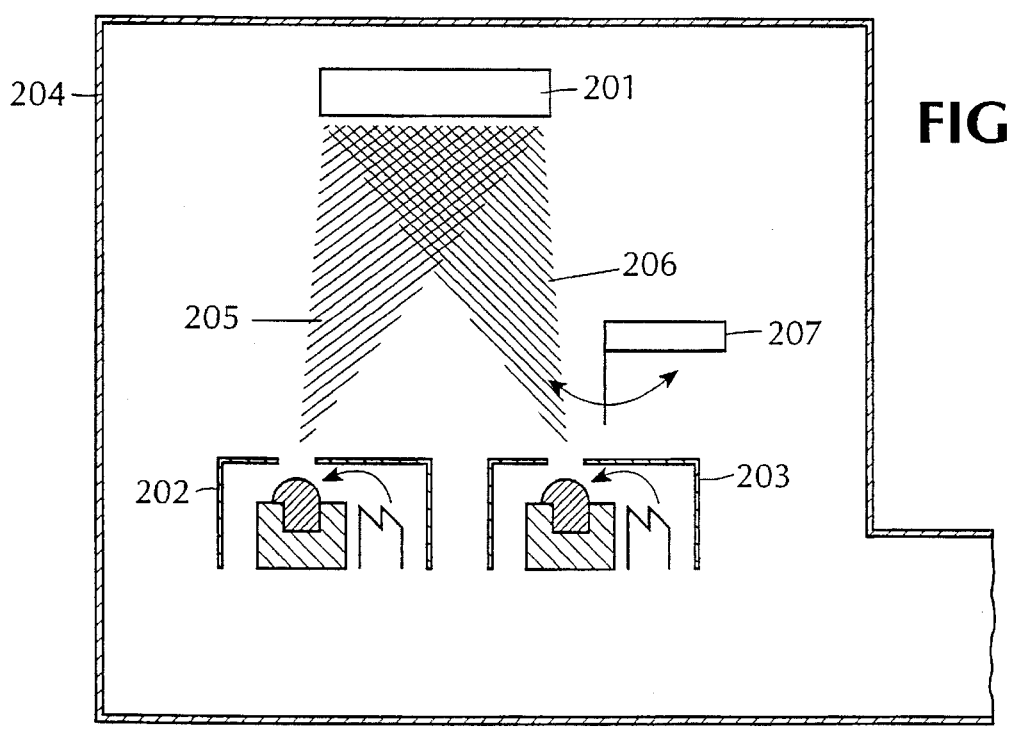
FIG. 2 schematically shows a deposition system which may be used to form the compositionally-graded intermediate layer, and subsequently deposit thereon a crystalline carbon-based thin film. The apparatus shown in FIG. 2 includes two evaporation sources which provide controllable fluxes of carbon and substrate atoms for forming the intermediate layer on the substrate surface.

In FIG. 2, a deposition system is shown which contains a silicon evaporation source 202 and a carbon evaporation source 203. These evaporation sources may be heated by conventional means, or alternatively may use an electron gun heating source. For example, the evaporation source for the carbon particles 203 may be an electron beam evaporation source in which a graphite target is evaporated by the electron beam. Electron beam evaporation is generally best suited for evaporating high melting point materials such as silicon and carbon. Alternatively, the silicon evaporation source may also be a Knudsen cell.

In operation, after the reaction chamber 204 is evacuated to a pressure that is desirably less than $1 \times 10^{-7}$ Torr, a silicon atom beam 205 and a carbon atom beam 206, respectively generated by electron beam heating of their corresponding target materials, impinges upon a silicon substrate 201. The intensities of the silicon and carbon beams may be individually controlled by adjusting the power applied to the electron beams in their respective evaporation sources. During the evaporation process, the silicon substrate 201 is maintained at a predetermined temperature in the range of 400°–900° C. in order to facilitate formation of the compositionally-graded intermediate layer from the deposition of the respective fluxes of silicon and carbon atoms.

During deposition, the flux of carbon atoms may be controlled by adjusting the intensity of the electron beam in the carbon evaporation source 203 and also by momentarily blocking the carbon atom beam 206 with a shutter 207. By maintaining the substrate 201 within the above-mentioned range of temperatures, and by controlling the intensity of the respective evaporating atoms, a high quality compositionally-graded intermediate layer can be formed on the silicon substrate 201.

Thus, in the above-described first embodiment, a compositionally-graded intermediate layer 102 is formed by causing a flux of substrate atoms (or particles containing such atoms) to impinge upon the substrate 201 simultaneously with a flux of carbon atoms (or particles containing carbon atoms), while the substrate is kept at a predetermined temperature. By continuously changing the respective fluxes of carbon and substrate atoms, a compositionally-graded intermediate layer is deposited.

After the compositionally-graded intermediate layer is formed, a crystalline carbon-based thin film may be deposited thereon by providing a particle flux of the atomic constituents of the carbon-based thin film. This particle flux may be generated in the reaction chamber 204 by the evaporation sources 202 and 203.

Figure 3:
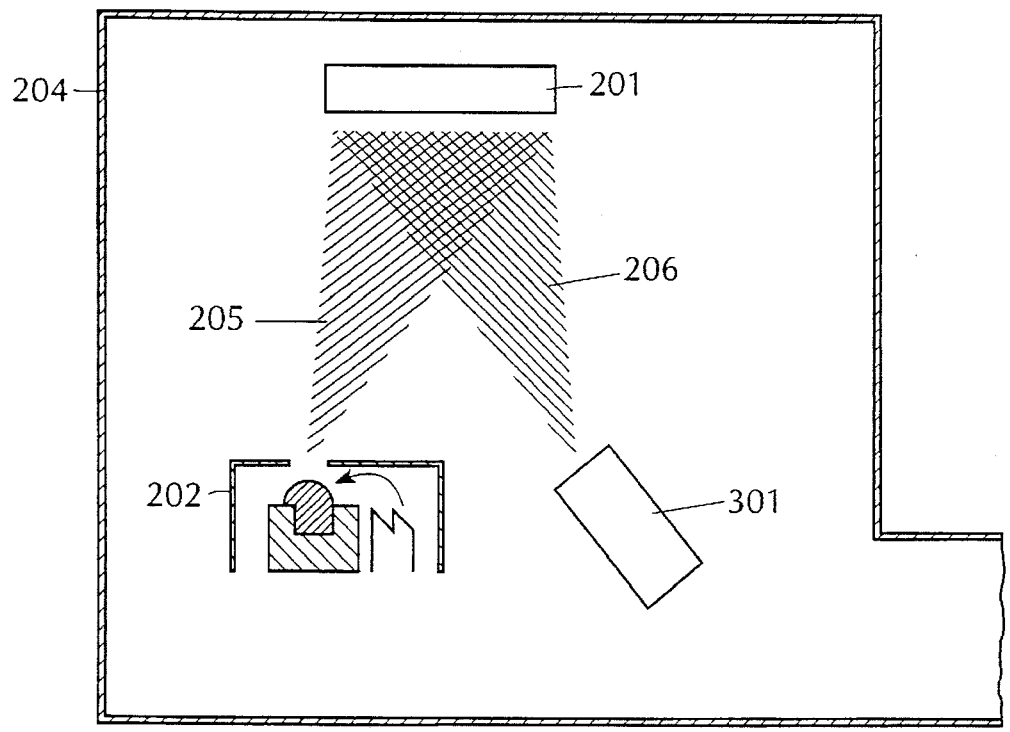
FIG. 3 schematically illustrates a second embodiment for a deposition system in which atoms for depositing the intermediate layer are provided by an evaporation source and an ion beam source.

A second embodiment for forming the compositionally-graded intermediate layer and subsequently depositing thereon a carbon-based thin film is shown in FIG. 3. With reference thereto, the reaction chamber 204 includes an ion beam source 301 for providing a particle beam of carbon that additionally contains energetic carbon ions. In this second embodiment, the amount of carbon in the compositionally-graded intermediate layer may be precisely controlled by controlling the ion beam flux. Carbon ions and/or hydrocarbon ions obtained by the electric discharge dissociation of a hydrocarbon gas within the ion source 301 may be directed at energies ranging from several tens to several thousands of electron volts onto the silicon substrate 201 by controlling the ion accelerating voltages within the ion beam source 301. The energetic ion beam irradiation of the growing film serves to improve the crystalline quality of the depositing film by allowing the deposited particles to migrate more freely on the surface of the film. Thus, by using energetic ions to impact the growing film surface, an improvement in the crystal orientation of the compositionally-graded intermediate layer may be attained.

Figure 4:
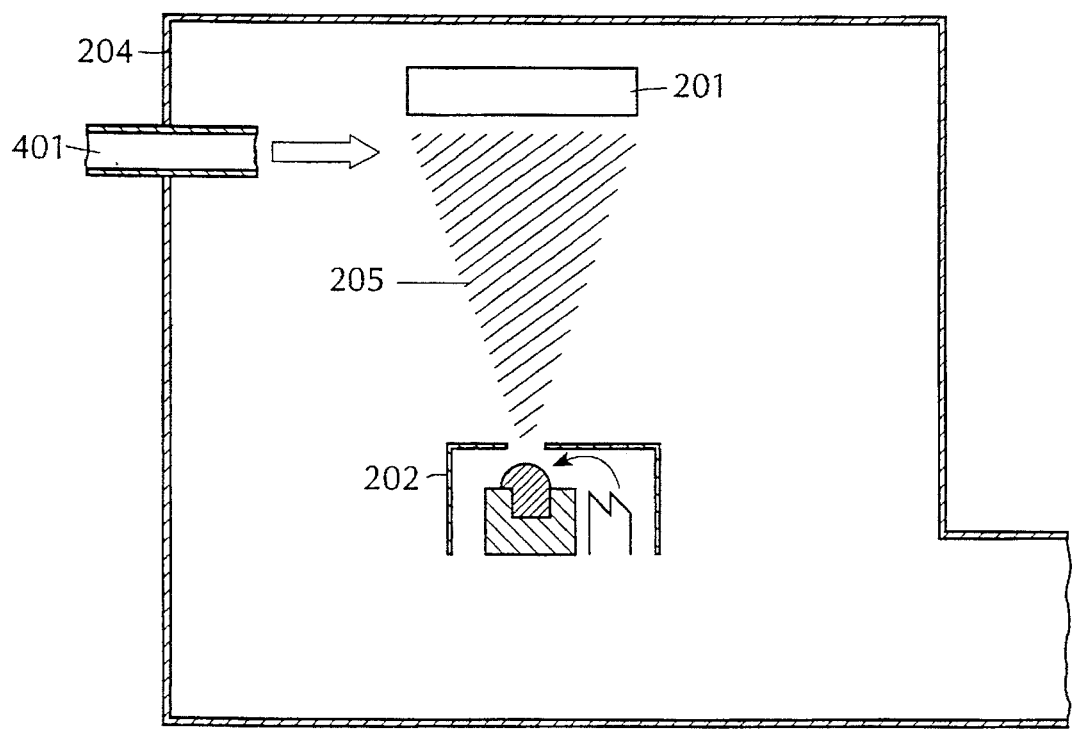
FIG. 4 schematically illustrates another embodiment for a deposition system in which atoms for depositing the intermediate layer are provided by an evaporation source and a gas supply.

FIG. 4 shows a third embodiment for depositing the compositionally-graded intermediate layer and carbon-based thin films of the present invention. In FIG. 4, the reaction chamber 204 contains a silicon evaporation source 202 and a gas duct 401 for supplying a carbon-containing gas. The silicon evaporation source 202 may be an electron beam evaporation source of the same general type as shown in FIG. 2. The supply of carbon atoms may be provided by a hydrocarbon gas introduced through the gas duct 401. In this third embodiment, a hydrocarbon gas may be dissociated by heat, light, or plasma energy supplied to the gas either prior to or after entering the reaction chamber 204. The dissociation produces carbon atoms which deposit to form the compositionally-graded intermediate layer 102. The relative abundance of carbon or silicon atoms in the depositing intermediate layer may be adjusted by controlling both the pressure of the hydrocarbon gas within the reaction chamber 204 and the flux of the evaporating silicon beam.

In this third embodiment, since chemical, thermal, or optical dissociation reactions may be utilized to decompose the hydrocarbon gas, by appropriately selecting the hydrocarbon gas the compositionally-graded intermediate layer may be formed on a substrate at a lower temperature, as compared to the previously described embodiments.

In accordance with the above method, high quality crystalline carbon-based thin films may be deposited by setting the ratio of carbon atoms to silicon substrate atoms at the surface of the compositionally-graded intermediate layer in the range of 0.9 to 1.1, so as to produce a surface which is substantially silicon carbide. Since the amount of carbon atoms that do not contribute to the crystal structure are very few within this range of ratios, few structural defects are produced on the surface of the compositionally-graded intermediate layer and the surface is substantially formed of silicon carbide crystals having a diamond crystal structure. Therefore, a high quality crystalline carbon-based thin film may thereafter be deposited on the compositionally-graded intermediate layer.

For example, although hetero-epitaxial growth of a silicon carbide thin-film directly on a silicon substrate is generally difficult to accomplish as a result of the lattice mismatch between silicon and silicon carbide, growth of a silicon carbide thin film on the silicon carbide surface of a compositionally-graded intermediate layer is rendered possible by this invention.

Additionally, formation of a compositionally-graded intermediate layer on a silicon substrate having the above-mentioned ratio of carbon to silicon at the surface thereof is also applicable to the deposition of diamond thin films.

Conventional deposition of diamond thin films on a silicon substrate results only in micro-crystallite formation because of the large mismatch in the lattice constants between silicon and the diamond crystal structure of carbon. Thus, there are very few sites available for growth of large single crystal diamond thin films, which have heretofore been prepared by homo-epitaxial growth on single crystal diamond substrate. When a compositionally-graded intermediate layer is first deposited on a silicon substrate with the above-mentioned surface compositional ratio, the lattice constant of the surface of the intermediate layer, being substantially silicon carbide, is a much closer match to that of diamond, and a diamond film subsequently deposited on the intermediate layer has highly improved crystallographic properties. To increase the nucleation density of diamond crystallites, it is desirable in some cases of diamond thin film deposition to provide a carbon-rich condition on the surface of the compositionally-graded intermediate layer.

To summarize in accordance with the above methods, the deposition of a crystalline carbon-based thin-film, as for example, diamond or silicon carbide, may be deposited under conditions where the lattice mismatch problem is alleviated. Accordingly, high quality crystalline carbon-based thin films may be obtained by first forming the compositionally-graded intermediate layer and then depositing the carbon-based film thereon.

The quality of the crystalline carbon-based thin film deposited on the compositionally-graded intermediate layer may be further improved by irradiating the growing surface of the thin film with energetic particles. The particles may be obtained by dissociating a gas or a mixture of gases containing the atomic constituents of the crystalline carbon-based thin film.

The invention disclosed herein is further illustrated by the following specific examples illustrating the deposition of a compositionally-graded intermediate layer, followed by the deposition of a carbon-based thin film thereon:

EXAMPLE 1

The apparatus shown in FIG. 2 has been used to deposit a compositionally-graded intermediate layer on a silicon substrate. Targets of silicon and graphite are respectively evaporated in the two electron beam heating sources in a vacuum of approximately $1 \times 10^{-8}$ Torr. The silicon substrate onto which the evaporated silicon and carbon species are deposited is heated to a temperature of approximately 850° C. The deposition rate of silicon is set in the range of 0.3–1.0 Angstroms/sec by controlling the electron beam current in the silicon evaporation source, while the deposition rate of carbon is continuously and gradually increased up to the same level as the silicon deposition rate by controlling the electron beam current in the graphite evaporation source and the position of the shutter 207. A compositionally-graded interface layer is thereby produced having a surface that is substantially silicon carbide with few lattice defects.

A high quality silicon carbide thin film may be deposited thereafter by a combination of conventional chemical vapor deposition (employing gases containing silicon and carbon atoms) and a reactive molecular beam evaporation employing a beam of carbon atoms.

The same deposition results have been obtained by replacing the silicon evaporation source with a Knudsen cell heated to a temperature of 1700° C. during the deposition of the compositionally-graded intermediate layer.

EXAMPLE 2

The apparatus shown in FIG. 3 has been used to deposit a compositionally-graded intermediate layer onto a silicon substrate. In this case, an electron beam evaporation source generates a flux of silicon atoms by evaporating a silicon target, while ion gun 301 is used to supply carbon-containing species. Deposition conditions are the same as in Example 1, except that the carbon ion source is set to produce ions having energies of approximately 500 eV.

During deposition the carbon ion current density is gradually increased to 0.5 mA/cm$^2$. This current density is sufficient to produce an excess carbon condition at the surface of the intermediate layer, while at the same time maintaining the surface in a proper crystalline orientation.

In this example, a diamond thin film is deposited on top of the intermediate layer by using a microwave CVD technique employing a carbon-containing gas. The quality of the diamond-like thin film obtained in this manner is far superior to that deposited on a silicon substrate without the compositionally-graded intermediate layer.

EXAMPLE 3

In this example, the apparatus shown in FIG. 4 is utilized. Methane gas is introduced through gas inlet 401 and is dissociated and reacted by a filament heated to a temperature of approximately 2000° C. to supply carbon atoms that form the compositionally-graded intermediate layer. The number of carbon atoms formed in this manner is controlled by adjusting the pressure of the methane gas. A silicon carbide thin film of high crystalline quality is thereafter readily deposited on top of the intermediate layer.

To summarize, in hetero-epitaxial deposition, the problems caused by lattice mismatch between a crystalline thin film and the substrate onto which it is deposited can be relieved by first depositing a compositionally-graded intermediate layer onto the substrate, in accordance with any one of the above described embodiments. The crystalline thin film is then deposited on top of the intermediate layer. Moreover, the quality of crystalline carbon-based thin films deposited in this manner may also be improved by irradiating the surface of the growing thin film with particles and ions obtained by dissociation of a carbon containing gas. The particles may also contain other atomic or ionic constituents of the growing thin film. In this manner, high quality crystalline carbon-based thin films may be readily deposited on large areas.

The deposition of the compositionally-graded intermediate layer and the deposition of the crystalline carbon-based thin film may be performed sequentially in the same reaction chamber by adjusting the parameters of the deposition process. In this way, a crystalline carbon-based thin film may be deposited immediately after growth of the compositionally-graded intermediate layer without contaminating the surface of the intermediate layer.

By operating in accordance with the preferred embodiments of this invention, it is possible to obtain a high quality crystalline carbon-based film during hetero-epitaxial growth on a substrate material which is compositionally different from the thin film composition without causing lattice mismatch problems. Further, the substrate material may be kept at a relatively low temperature.

Although the invention herein has been described with reference to particular embodiments, it is to be understood that these embodiments are merely illustrative of the different aspects and features of the invention. As such, a person skilled in the art may make numerous modifications to the illustrative embodiments described herein and other arrangements may be devised to implement the invention, without the departing from the spirit and scope of the invention described and claimed herein.

What we claim is:

1. A method for hetero-epitaxial growth of crystalline silicon carbide or crystalline diamond film on a substrate comprising a substrate material, said method comprising the steps of:

a) providing sources for generating a flux of said substrate material and carbon in a reaction chamber evacuated to a predetermined pressure;

b) depositing under hetero-epitaxial growth conditions a compositionally-graded intermediate layer including said substrate material and carbon on said substrate, wherein the composition of a lower surface of said compositionally-graded intermediate layer in contact with said substrate is substantially that of the substrate material and the composition of an upper surface thereof is substantially that of said crystalline silicon carbide or crystalline diamond film and wherein the carbon content increases in a direction away from said substrate, said hetero-epitaxial growth conditions allowing said substrate material and carbon to migrate; and c) depositing said crystalline silicon carbide or crystalline diamond film on said compositionally-graded intermediate layer.

2. The method of claim 1 wherein said substrate material is silicon.

3. The method of claim 1 wherein carbon and said substrate material at a top surface of said compositionally-graded intermediate layer are in a ratio in the range of 0.9 to 1.1.

4. The method of claim 1 wherein said compositionally-graded intermediate layer is deposited by:

a) providing an evaporation source of said substrate material; and b) independently controlling the relative fluxes of said substrate material and carbon to co-deposit said compositionally-graded intermediate layer.

5. The method of claim 1 wherein said source of carbon is a predissociated hydrocarbon gas.

6. The method of claim 4 wherein said source of carbon is a carbon particle flux.

7. The method of claim 6 wherein said carbon particle flux is ionized.

8. The method of claim 4 wherein said substrate material is silicon.

9. The method of claim 8 wherein said source of carbon is a predissociated hydrocarbon gas.

10. The method of claim 8 wherein said source of carbon is a carbon particle flux.

11. The method of claim 10 wherein said carbon particle flux is ionized.

12. The method of claim 1 wherein said compositionally-graded intermediate layer is deposited by:

a) providing a first source for evaporating the substrate material;

b) providing an ion source for producing a flux of carbon including ionic carbon; and c) independently co-depositing said substrate material and carbon onto said substrate by independently controlling the relative fluxes of said substrate material and carbon to form said compositionally-graded intermediate layer.

13. The method of claim 12 wherein said silicon carbide or crystalline diamond film is formed by utilizing said ion source for depositing at least ionized carbon species.

* * * * *